(12) United States Patent
Barbier et al.

(10) Patent No.: US 10,034,111 B1
(45) Date of Patent: Jul. 24, 2018

(54) TOF BASED GAIN CONTROL

(71) Applicant: STMicroelectronics, Inc., Coppell, TX (US)

(72) Inventors: Dominique Paul Barbier, Scotts Valley, CA (US); Xiaoyong Yang, San Jose, CA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/593,103

(22) Filed: May 11, 2017

(51) Int. Cl.
*H04R 29/00* (2006.01)
*H03G 3/30* (2006.01)
*H04R 3/00* (2006.01)
*G01S 17/08* (2006.01)

(52) U.S. Cl.
CPC ............ *H04R 29/004* (2013.01); *G01S 17/08* (2013.01); *H03G 3/301* (2013.01); *H04R 3/005* (2013.01); *H04R 2430/20* (2013.01)

(58) Field of Classification Search
CPC ...................................................... H04R 29/00
See application file for complete search history.

(56) References Cited

U.S. PATENT DOCUMENTS

| | | | | |
|---|---|---|---|---|
| 5,586,191 A | * | 12/1996 | Elko | H04R 1/38 381/92 |
| 2012/0281850 A1 | * | 11/2012 | Hyatt | H04R 1/1041 381/74 |
| 2013/0094668 A1 | * | 4/2013 | Poulsen | H03G 3/301 381/107 |
| 2013/0202130 A1 | | 8/2013 | Zurek et al. | |
| 2014/0112483 A1 | * | 4/2014 | Etter | H03G 3/3005 381/56 |

* cited by examiner

*Primary Examiner* — Olisa Anwah
(74) *Attorney, Agent, or Firm* — Seed IP Law Group LLP

(57) ABSTRACT

The present disclosure is directed to a gain control system that receives a signal and outputs a modulated signal. The signal modulation is based on a gain that is based on a detected distance between the gain control system and a user. The distance is detected with a ranging sensor which generates ranging data for a field of view, and then the gain control system analyzes the ranging data to identify the user, with a higher signal gain for the user at a greater distance and a lower signal gain for the user at a lesser distance.

20 Claims, 11 Drawing Sheets

TOF BASED GAIN CONTROL

BACKGROUND

Technical Field

The present disclosure is directed to a system for adjusting a signal, and, in particular, to a system that adjusts gain of an audio signal based on a distance from a user.

Description of the Related Art

In current microphone systems, a received audio signal is post-processed, often with algorithms to optimize the audio signal. For example, a microphone detects a sound and converts the sound to an electrical signal. The electrical signal is transmitted to a microcontroller, which outputs the received electrical signal in a standard format for transmission to another system, such as speakers.

In some of these systems, audio processing optimizes the audio quality. These systems can use post-processing algorithms to adjust the volume of the signal or isolate noise in the signal. One way to post-process the audio signal is to determine a rolling average of the received signal amplitude over a period of time, such as 1 second, and then set a gain based on the average amplitude. The gain of the signal is decreased if the average signal amplitude is high and the gain of the signal is increased if the average signal amplitude is low. The gain is applied to the signal received and subsequently output by the system. This improves the sound quality of the signal heard by or otherwise received by a user.

To avoid adding a delay or lag in the signal, these systems will apply a gain determined from the previous recording period to the current signal. Said differently, the output signal will be modulated with a gain from analysis of previously received signals, not the current signal. Thus, any sharp changes in signal amplitude of the current signal will not be immediately compensated for in the output signal. For instance, if a first user is talking into a mobile phone microphone with the above system, and moves from a noisy environment with the first user talking loudly to a quiet environment with the first user talking softly, the system will not immediately adjust for the change from the noisy to the quiet environment. Instead, the system will attenuate the first user's voice out of hearing range of a second, listening user for a time period.

In the above case, the overall signal amplitude from the previous noisy environment will drive a low signal gain until the rolling average covers only signals from the new quiet environment. As such, the gain is increased as rolling average of the signal amplitude decreases from the noisy to the quiet environment.

The opposite problem occurs moving from a quiet environment to a noisy environment. After the transition the gain will be set too high because of the lag in the rolling average. The high gain will then cause the output signal to have too high of an amplitude, and will cause discomfort to the listening user, or will cause distortion in the playback due to signal capping by the signal exceeding the playback range of a playback system.

Another issue that arises is when the desired sound source is a low amplitude relative to the ambient noise. The system is unable to identify that the desired sound is at a low amplitude, and that, despite the undesirable second order effects, the signal needs to be kept at a high amplitude to enable the desired sound to be detected during playback.

In other known systems, post-processing algorithms filter out noise. One way to filter noise out of the audio signal is to identify desirable frequencies and use a frequency based filter to attenuate frequencies not in the desired frequency band. For example, a frequency band can be set to [200 Hz to 2 kHz] as the primary frequencies of human speech. The system then filters out frequencies below 200 Hz or above 2 kHz.

These systems typically suffer from the inherent difficulty in differentiating noise from the desired sound. In normal environments, noise occurs across a wide spectrum of frequencies, and is not limited to just the frequencies outside of the range of human speech. The desired band of frequencies can be set narrowly to eliminate a larger proportion of noise from the audio signal. However, then some frequencies of the desired sound are also typically lost, degrading the desired audio signal. To maintain the signal quality of the desired sound, the band can be set to cover a wide range of frequencies. But this configuration suffers from poor effective noise removal because the wide band pass filter is not able to eliminate the noise in the wide band pass range. In addition, these systems are unresponsive to the problem of multiple users speaking as the desired sound and the undesired sound are both in the same frequency range.

BRIEF SUMMARY

The present disclosure is directed to a system of automatically adjusting a signal gain based on a distance from a user to a microphone. The system quickly adjusts the signal according to user distance while being indifferent to varied ambient noise environments, and with different users at different distances, in some embodiments.

The present disclosure is further directed to a gain control system that modulates a signal according to a gain that is based on data from a ranging sensor. The ranging sensor is used to detect the presence of a user and, in some embodiments, a distance between the user and the gain control system. The gain control system then sets a gain for the signal based on the distance between the gain control system and the user, with a higher gain for users a farther distance from the gain control system and a lower gain for users a shorter distance from the gain control system.

In one embodiment, the gain control system is coupled to a microphone. The microphone transduces detected sounds into an electrical signal and transmits that electrical signal to the gain control system. The gain control system then modulates the electrical signal based, in part, on the gain calculated by the gain control system. The gain control system outputs the modulated electrical signal for use by any number of other systems with audio line inputs, such as speakers or computers.

In another embodiment, the gain control system is coupled to a speaker. The speaker transduces an electrical signal into audible sounds. The gain control system modulates a received signal based, in part, on the gain calculated by the gain control system. The gain control system outputs the modulated electrical signal to the speaker to be transduced into audible sound. The received signal may be received from any number of other systems with audio line outputs, such as microphones or computers.

In yet another embodiment, the gain control system is coupled to a transmission line input and a transmission line output. Unlike the embodiments above, the system may also be an in-line system that is not directly coupled to any input/output devices, but rather is embedded somewhere in a transmission line between input/output devices. In this embodiment the gain control system receives a received signal and ranging data through another device, such as a network controller. The gain control system then modulates the received signal based, in part, on the ranging data. The modulated signal is then output to the transmission line to be forwarded along the transmission path.

The present disclose is also directed to a device and method. The device is configured to control the gain of a signal based, in part, on the detection of a user. The method is a method of detecting a user and modulating an electrical signal to be output as an input or output to another device or system.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense; that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

The present disclosure is directed to systems, devices, and methods for setting the gain of a signal based, at least in part, on a distance between the systems, or devices, and a user. For example, the system can include a gain controller, a ranging sensor, and a microphone. The microphone produces an audio signal from detected sounds that is transmitted to the gain controller and the ranging sensor produces a ranging data signal representing the detected distance between the system and a user. The system then modulates the audio signal based on the ranging data signal and outputs a modulated audio signal.

Figure 1:
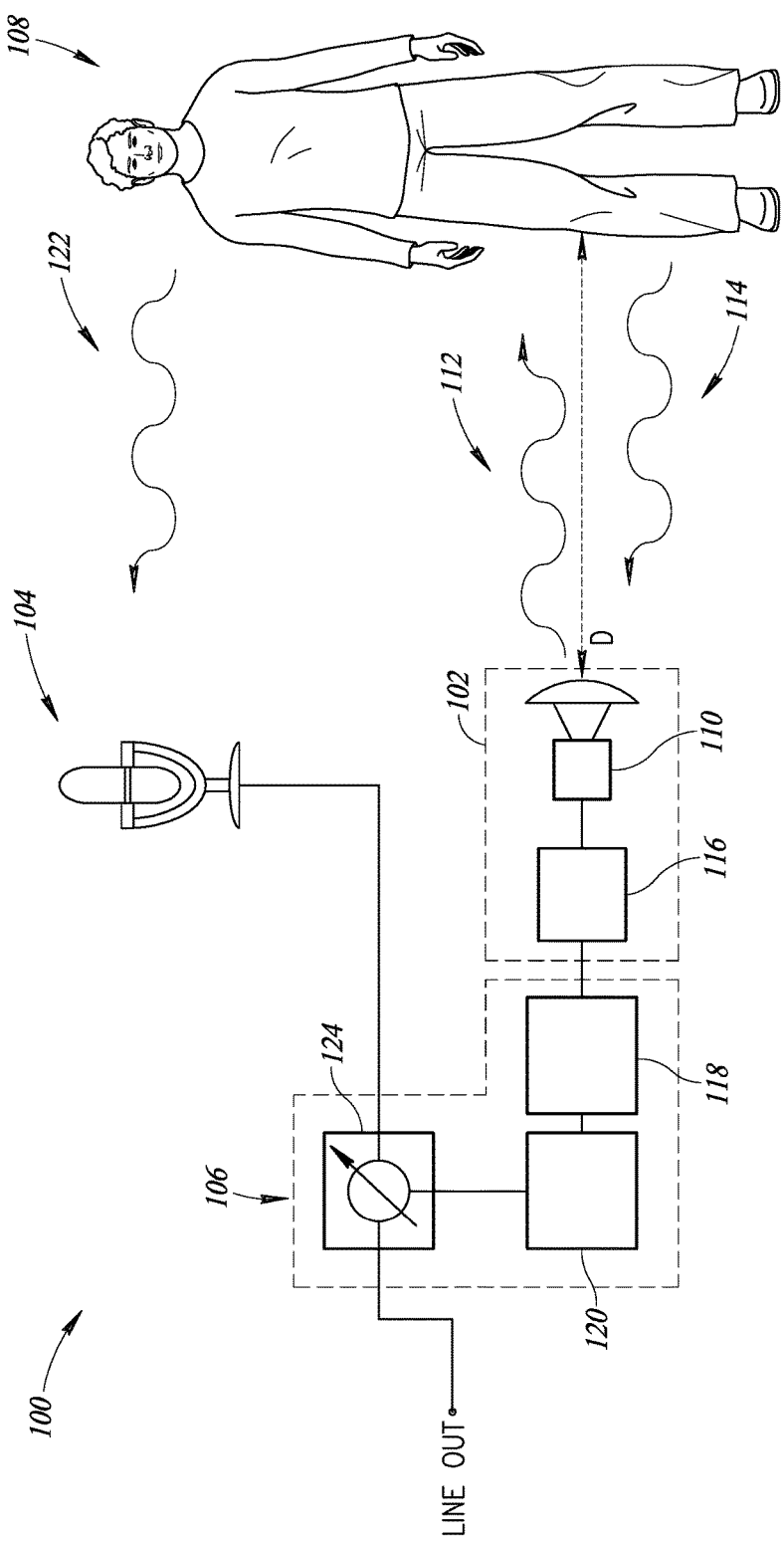
FIG. 1 is a schematic of one embodiment of a gain control system with a microphone.

In some embodiments, the modulation of the audio signal is proportional to the distance detected by the ranging sensor. In this embodiment, the gain increases as the distance between the system and the user increases and the gain decreases as the distance between the system and the user decreases. As a user moves further from the system (less proximate), the audio signal from the microphone is modulated to amplify the signal and as a user moves closer to the system (more proximate), the audio signal is modulated to attenuate the signal. Thus, the amplitude of the portion of the audio signal for the user's speech is normalized such that when the user is further from the system the volume is the same as when closer to the system FIG. 1 is one embodiment of a gain control system 100 configured to receive signals and to modulate those signals according to various algorithms based on user detection. The system includes a microphone 104 to capture sounds from a user 108. The gain control system modulates recordings of the user sounds according to a distance between the gain control system and the user to compensate for volume variations due to distance. The system may be a singular unit or may include components that are physically separated from each other. In some embodiments, the gain control system 100 is part of a mobile system that is not physically connected to any other electrical component, such as a mobile device.

The gain control system 100 includes a ranging sensor 102. The ranging sensor 102 has a field of view and can detect distances from the ranging sensor 102 to an object in the field of view. The ranging sensor 102 may be any type of ranging sensor. One example is a laser time-of-flight (ToF) ranging sensor, which is discussed in further detail with respect to FIG. 2.

The gain control system 100 also includes the microphone 104. The microphone 104 may be any type of electroacoustic transducer for converting sound into an electrical signal.

The gain control system 100 also includes a processor 106. The processor 106 is an application-specific integrated circuit (ASIC) in one embodiment. In another embodiment, the processor 106 is a general purpose computer chip programmed to provide the functions discussed in this disclosure. The processor 106 has a first input coupled to an output of the ranging sensor 102. The processor 106 has a second input coupled to the output of the microphone 104 to receive the electrical signal from the microphone 104.

The processor 106 receives the ranging data generated by the ranging sensor 102 and uses that ranging data to determine the presence of the user 108. The processor may be set to detect the user 108 as a person of typical size, persons of any known size, or any person or group of persons in between those. For example, the user 108 may refer to adult sized persons. In addition, user 108 may be a single person, or may refer to multiple persons singularly or as a group.

The ranging sensor 102 includes an optical sensor 110. The optical sensor 110 includes at least one of any number of optical devices, including a light-emitting diode and a single photon avalanche diode (SPAD). In some embodiments, the optical sensor 110 includes more than one optical device, such as at least one signal generator and one signal detector. Other numbers of devices are also within the scope of the present disclosure, such as one signal generator and two signal detectors.

The optical sensor 110 generates a broadcast optical signal 112. The broadcast optical signal propagates away from the optical sensor 110. The broadcast optical signal 112 may be any type of optical signal, but in some embodiments is a laser signal. The laser signal may be narrowly focused or may use a lens to be widely spread. In addition, multiple laser signals may be generated in different directions, either with time division and a pointing mechanism, or with multiple optical signals being generated or with an optical signal being split into multiple signals.

The broadcast optical signal 112 is reflected off of an object, such as the user 108, to become a return optical signal 114. The return optical signal 114 is a portion of the broadcast optical signal 112 that is reflected so that the signal returns along a same optical path that it propagated out from the optical sensor 110 on, but in the opposite direction. Other portions of the broadcast optical signal 112 may not be reflected by the object, or may reach the object, but not be reflected along the same optical path.

The return optical signal 114 is detected at the optical sensor 110. As discussed above, the optical sensor 110 may include a device such as a SPAD. The SPAD generates an electrical signal when the optical sensor 110 receives the return optical signal. The electrical signal may be a voltage, a current, a capacitance, or any other electrical signal.

The time of detection of the return optical signal 114 is determined by a range estimation circuit 116. The range estimation circuit then compares the time of generation of the broadcast optical signal 112 to the time of detection of the return optical signal 114. The time of generation is subtracted from the time of detection to get a time duration between generation and detection of the signals. If the speed of the signals is known, then the speed can be multiplied by the time duration to get a distance. The distance can then be divided by two to account for the propagation distance and the return distance both being included. This gives the absolute distance D between the optical sensor 110 and the object, such as the user 108. In other embodiments the time duration is compared to time durations representing the detection range of the sensor to assign a scaled value to the time duration.

The optical sensor 110 and the range estimation circuit 116 are part of a singular device that is the ranging sensor 102. In other embodiments, the optical sensor 110 and the range estimation circuit 116 are physically separated components of a system that is the ranging sensor 102. The output of the range estimation circuit 116 is the output of the ranging sensor 102 of the ranging data. Further details and variations of the ranging sensor 102 are discussed with respect to FIGS. 2-4 below.

There are many different ways to determine the presence of the user 108 from the ranging data, and each way can be used in the present disclosure. For example, the processor 106 can store previous ranging data and compares it to the most recent ranging data. The processor 106 can store one or more previous values of the ranging data, and then compare the ranging data history to the current ranging data. A difference in the ranging data as compared to previous ranging data is suggestive of a presence of the user 108, and can be used to trigger the determination that the user 108 is present. In other embodiments, the ranging data has a stored profile of ranging data including one or more values, the processor 106 then compares the received ranging data against the static stored profile to see if there is a match. In one example of this implementation, the processor 106 stores an outline of the user 108 and compares the ranging data to the stored outline to determine where the changes in the ranging data values occur. Other embodiments include other methods for determining the presence of the user 108.

The processor 106 has a user detector 118 that receives the ranging data and determines a position of the user 108. The ranging sensor 102 outputs raw ranging data, which associates a direction from the optical sensor 110 with a distance D between the optical sensor 110 and an object, such as the user 108. The ranging data, in its simplest form, is a singular numerical value with a fixed direction of the ranging sensor 102. In some embodiments with more complex ranging sensors, the ranging data includes a large matrix of distance values for various directions from the ranging sensor. The ranging data is communicated to the user detector 118 of the processor 106 so that the user detector 118 can determine if the user 108 is present, and how far the user 108 is from the optical sensor 110. The user detector 118 may detect changes in the ranging data over time, identify data profiles that match user presence, or use any other method to detect a user from the ranging data. The user detector 118 can be a module of the processor 106. Alternatively, the user detector 118 includes dedicated circuitry for determining a position of the user, such as an ASIC.

The processor 106 includes a gain generator 120 coupled to the user detector 118 to compute a gain. The gain generator 120 generates a gain signal based on the user detector 118 determining a position of the user 108. As will be discussed in detail below, the gain signal changes with respect to the user 108 being present, and in some embodiments varies with the distance D between the user 108 and the optical sensor 110. This variable signal is output by the gain generator 120. The gain generator 120 can be a module of the processor 106. Alternatively, the gain generator 120 includes dedicated circuitry for generating the gain signal, such as an ASIC.

The processor 106 is coupled to the output of the microphone 104 to receive the electrical signal from the microphone 104. The electrical signal is generated by the microphone in response to detecting a sound 122. The sound 122 may be from the user 108, or may be any vibration in the audible range of the microphone 104. The sound represents speech in some embodiments. The speech is converted into the electrical signal and the electrical signal is transmitted to the processor for signal conditioning. The initial stages of signal conditioning can occur at the microphone 104. Alternatively, the processor 106 is coupled to other devices and receives an electrical signal other than the electrical signal generated by the microphone 104 from the sound 122.

The processor 106 includes a signal modulator 124. The signal modulator 124 receives the electrical signal from the microphone 104 and the gain signal from the gain generator 120. The signal modulator 124 then modulates the electrical signal to produce a modulated electrical signal. The signal modulator 124 modulates the electrical signal by adjusting the electrical signal based on the gain signal. For example, the signal modulator may be a multiplier that multiplies the electrical signal by the gain signal. In other embodiments, the electrical signal is modulated according to gain signals having other functions, as will be discussed in further detail below. The signal modulator 124 can be a module of the processor 106. Alternatively, the signal modulator 124 includes dedicated circuitry for modulating the electrical signal, such as an ASIC.

The signal modulator 124 of the processor 106 modulates the electrical signal from the microphone 104 by any number of functions produced by the gain generator 120. For example, a multi-stage linear functional relationship; however, other functional relationship may be represented, from a simple Heaviside function, a linear function, a complex polynomial, or any other functional relationship.

Figure 5:
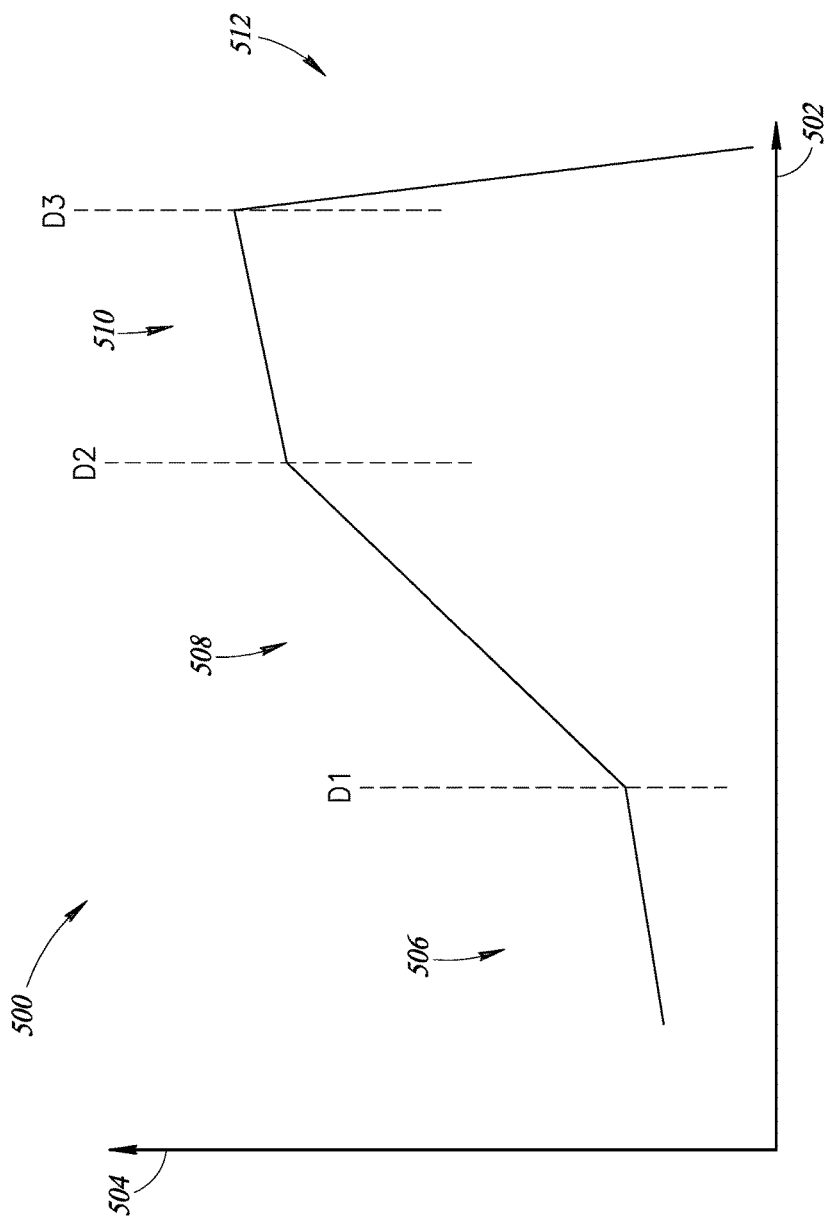
FIG. 5 is a graph of one embodiment of a gain function based on distance to a user.

FIG. 5 illustrates one embodiment of a gain function 500 implemented by the gain generator 120. The gain function 500 is plotted on a graph having an x-axis 502, which represents the distance D between the optical sensor 110 and the user 108. The far left of the x-axis 502 represents zero meters of distance D between the optical sensor 110 and the user 108. The far right of the x-axis 502 represents five meters of distance D between the optical sensor 110 and the user 108. The y-axis 504 represents the gain generated by the gain generator 120. The bottom of the y-axis 504 represents a gain having a value of zero, and the top of the y-axis 504 represents a gain having a value of one. Other values for each axis are possible.

The gain function 500 includes multiple stages. At a distance D of zero, the gain generator is unresponsive, having no gain value associated with the distance D of zero. At some positive, non-zero value of the distance D, the gain generator 120 produces a positive non-zero value of the gain. The minimum distance may coincide with the detection limit of the ranging sensor, or may be set independently. Additionally, the gain is sensitive to changes in the distance; as the user moves away from the microphone, the gain is increased to amplify sounds. Thus, the gain generator 120 has a linear response in the first mode in which as the distance D increases, the gain increases according to a linear relationship with a positive slope.

A first stage 506 of the gain function 500 includes a linear portion having a positive slope. In this example, the first stage 506 represents a private mode of communication in which the user 108 is determined to be close (or more proximate) to the gain control system 100, and thus a low overall gain is needed. A person can communicate through the gain control system 100 without signal amplitudes being so loud that the communication is public. For example, with respect to the gain control system 100, the user is less than a first distance D1, such as 0.5 meters, to the microphone 104, so the signal can have a lower gain to maintain a normalized volume for a listener or a recording device, but a gain high enough that low volumes can be maintained in communicating with the user 108.

At the first distance D1 of the first stage 506, the gain function 500 begins a second stage 508 including a linear portion having a positive slope. The second stage 508 represents a personal mode of communication in which the user 108 is determined to be a moderate distance, such as between 0.5 meters and 3 meters, from the gain control system 100. The slope of the gain in the second stage 508 is greater than the slope of the gain in the first stage 506. This can be for any number of reasons, including taking into account that sounds experience an inverse squared decay of intensity over distance, or that, when the user 108 is farther away, other competing environmental sound sources might be closer than the user 108. Thus, at the intersection of the first stage 506 and the second stage 508, the gain increases according to a linear relationship with the changing distance D, but at a faster rate in the second stage 508 than in the first stage 506.

At the second distance D2 of the second stage 508, the gain function 500 begins a third stage 510 including a linear portion having a positive slope. The second distance D2 is 3 meters. The third stage 510 represents a group or far mode of communication in which the user 108 is determined to farther from the gain control system 100. The slope of the gain in the third stage 510 is smaller than the slope of the gain in the second stage 508, and is comparable to the slope of the gain in the first stage 506. The slope in the third stage 510 can be set based on any number of reasons, including taking into account that it may cause too much distortion to keep increasing the gain at the same rate as the second stage 508, or that there might be too much amplification of environmental sounds. Thus, at the intersection of the second stage 508 and the third stage 510, the gain increases according to a linear relationship with the changing distance D, but at a slower rate in the third stage 510 than in the second stage 508.

At a third distance D3 of the third stage 510, the gain function 500 begins a fourth stage 512 including a linear portion having a negative slope. The third distance D3 is 5 meters. The fourth stage 512 represents an out-of-range mode of communication in which the user 108 is determined to be a distance beyond that expected for communication through the gain control system 100. The slope of the gain in the second stage 508 is high magnitude, and negative. This can be for any number of reasons, including that the system determines that the user 108 is not intending to communicate through the gain control system 100 and all signals should be filtered out for privacy or to control for possible ambient noise. Thus, at the intersection of the third stage 510 and the fourth stage 512, the gain decreases according to a linear relationship at a high rate. In addition, at some point the gain function 500 ends, and any greater distance D the gain function 500 produces no gain value. This distance limit may coincide with the detection limit of the ranging sensor, or may be set independently.

While FIG. 5 depicts the gain function 500 being a multistage linear function, other functions are within the scope of the disclosure. For example, one modification would be to have more or less stages, including only having one stage at one extreme, and having as many stages as detectable distances, thus creating a look-up table in which each discrete value of distance D corresponds to an independent gain value. Additionally, linear functions are shown in each stage, however any function may be used, such as logarithmic, polynomial, trigonometric, differential, limits, and any other mathematical expression.

Returning to FIG. 1, the modulated electrical signal is output by the processor 106 at a Line Out port. The Line Out port is a standard 3.5 mm audio jack. The voltage peaks of the output signal are less than +/− five volts. Alternatively, other port connectors or other signals are used.

The gain control system 100 also includes the microphone 104. The microphone 104 may be any type of electroacoustic transducer for converting sound into an electrical signal. In some embodiments, the microphone 104 is a microphone array. The microphone 104 detects sounds, such as the vibration of molecules in the environment causing a change in pressure at the microphone 104. The electrical signal may use any means for storing the information about the detected sounds. For instance, the changes in the sound pressure can be converted into a variable voltage signal. Alternatively, the changes in the sound pressure are converted into a varying current signal. The electrical signal from the microphone 104 may be directly output, or may undergo signal conditioning at the microphone 104 before being output. Examples of signal conditioning include signal amplification and signal noise reduction.

Figure 6:
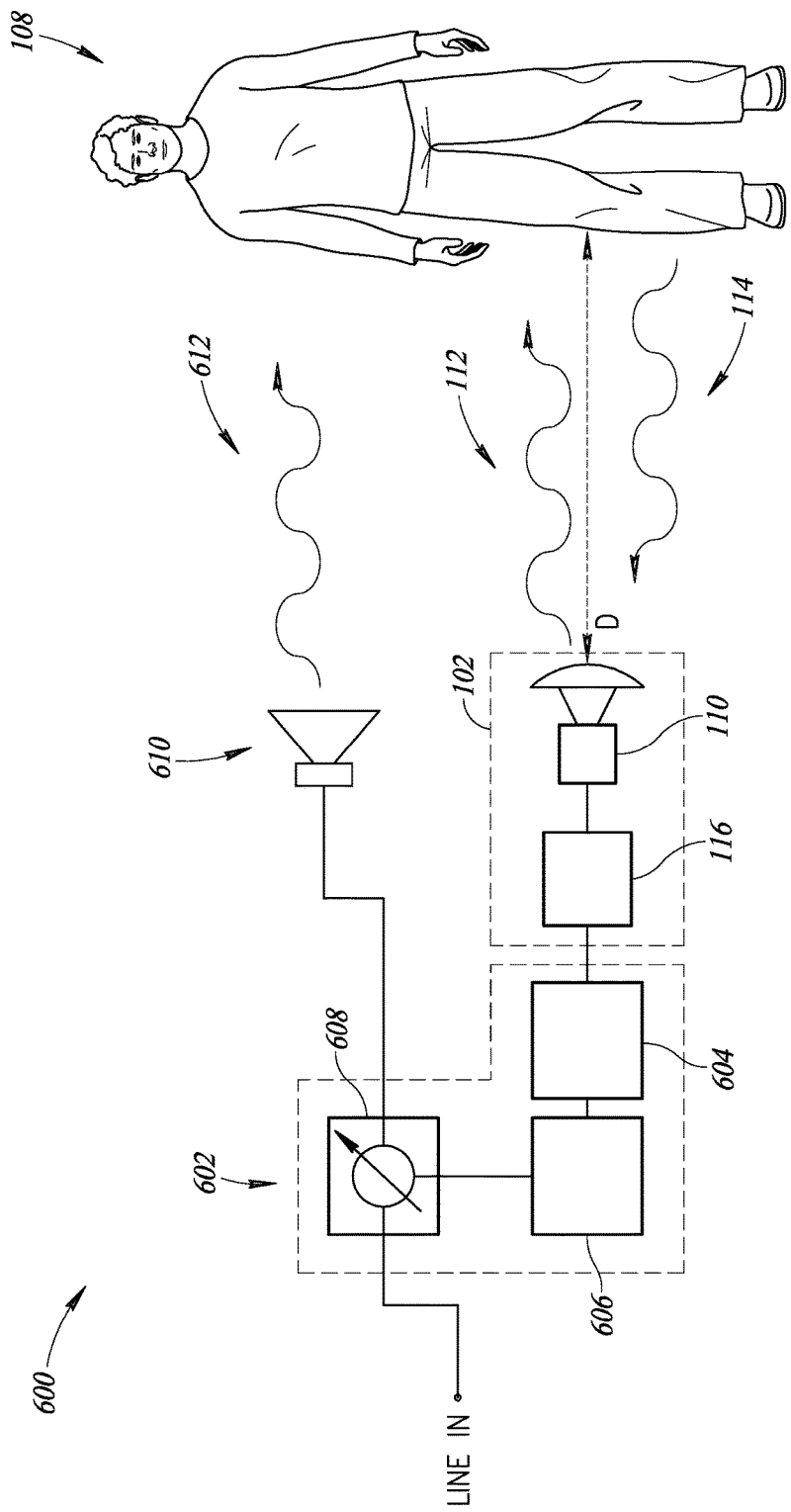
FIG. 6 is a schematic of one embodiment of a gain control system with a speaker.

FIG. 6 is an alternative embodiment of a gain control system 600 with a speaker 610 instead of the microphone 104 of the gain control system 100 of FIG. 1. In particular, the gain control system 600 includes the ranging sensor 102 with the optical sensor 110 and the range estimation circuit 116 to determine distance D. Both gain control systems 100, 600 include the ranging sensor 102. Various ranging sensors may be included. One example ranging sensor is described in more detail in FIGS. 2 and 3.

Figure 2:
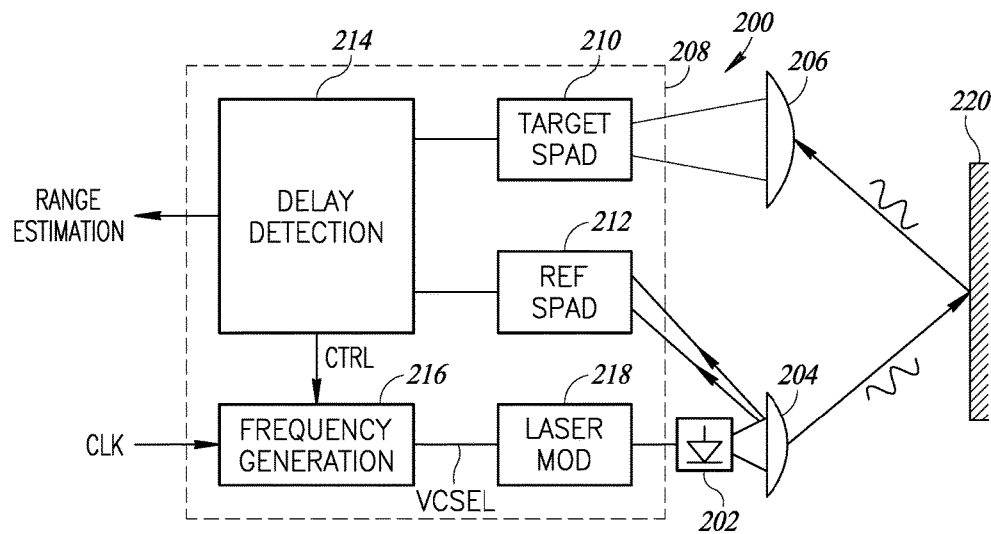
FIG. 2 is a schematic of a ranging sensor.

In particular, FIG. 2 is a time of flight (ToF) ranging device 200 that includes a SPAD array. ToF ranging sensor uses time of return for a broadcast optical signal to calculate range. The device 200 includes a light source 202 that generates an optical signal, such as a beam of optical pulses, transmitted into the image scene via a lens 204. The optical signal propagates into the space visible to the sensor and reflects off any non-transparent surfaces. The reflection is in the opposite direction as the propagation of the light from the light source, as a return optical pulse. The return optical pulses are received via a further lens 206.

The ranging device 200 includes a range estimation circuit 208 that includes a reference SPAD array 212 and a target SPAD array 210 to record the optical pulses and to estimate the distance between the device 200 and an object 220 in the image scene against which the optical pulses reflect. The target SPAD array 210 receives the return optical pulses via the lens 206.

The reference SPAD array (REF SPAD) 212, which is of the same dimensions or of smaller dimensions than the target SPAD array 210, and receives an internal reflection of the transmitted optical pulses.

A delay detection circuit (DELAY DETECTION) 214 is coupled to the target SPAD array 210 and to the reference SPAD array 212, and estimates the delay between each transmitted optical pulse and the return optical pulse received by the target SPAD array 210, in order to provide a range estimation (RANGE ESTIMATION) of the object 220. The range estimation circuit 208 also includes a frequency generation circuit (FREQUENCY GENERATION) 216, which generates a voltage signal VCSEL provided to a laser modulation circuit (LASER MOD) 218 for generating a signal for driving the light source 202. The delay detection circuit 214 provides a control signal CTRL to the frequency generation circuit 216 for controlling the period of the signal VCSEL.

The optical wavelength used for the optical pulse is invisible to the human eye. Various means can be used to split the field of view of the ToF sensor to generate more than one distance per sensor per time interval. For instance, mechanical lens pointing can be used to scan an area and produce multiple distance readings per time interval. In other embodiments, an array of photosensors in the ranging sensor may be positioned so that they receive return optical signals from different angles, allowing for multiple distance readings to be taken within the overall field of view of the ranging sensor 102. Thus a wide range of different sets of data are produced by the ranging sensor 102 in the various embodiments.

Figure 3:
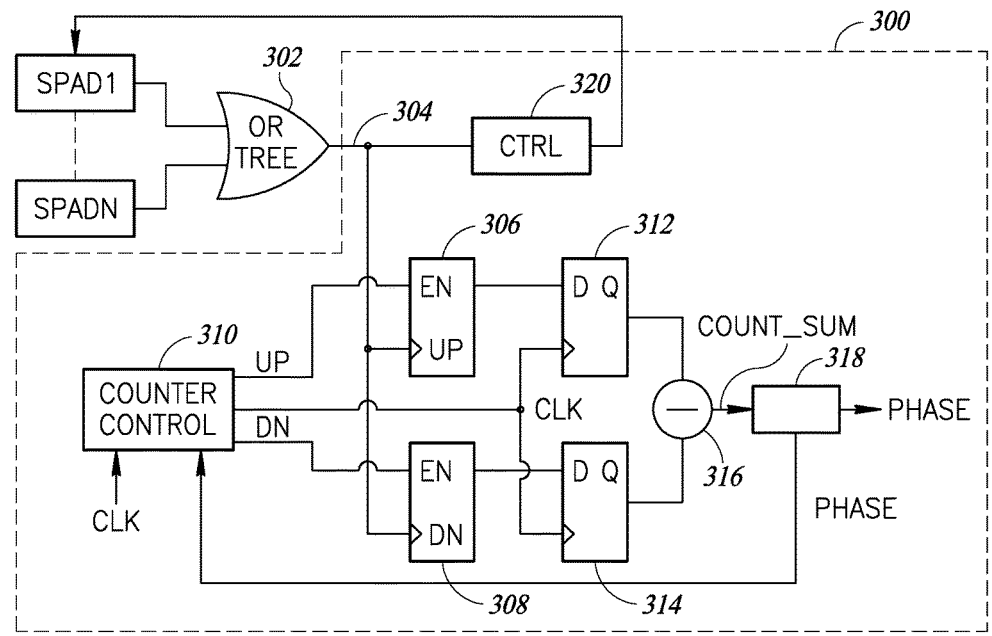
FIG. 3 is a schematic of a delay detection circuit of the ranging sensor of FIG. 2.

FIG. 3 schematically illustrates a circuit 300 forming part of the delay detection circuit 214 of FIG. 2 in more detail according to one embodiment in which the outputs of all of the SPAD cells of the target SPAD array 210 are combined onto a single line. In particular, an OR tree (OR TREE) 302 has inputs respectively coupled to the output of each of the SPAD cells SPAD1 to SPADN of the target array 210, and provides, on its output line 304, pulses generated each time an event is detected by any of the SPAD cells. A control circuit 320 is coupled to the output line and to the SPAD array to control which one or more SPAD cell of the target SPAD array 210 is active.

The circuit 300 includes counters coupled to the output line 304 for counting the detected events. A clock signal CLK drives a counter control 310. The counter control in turn drives up counter (UP) 306 and down counter (DN) 308. The outputs of the counters are communicated to respective flip-flops 312 and 314, whose outputs are subtracted by subtraction unit 316 to produce a signal COUNT_SUM. A phase detection circuit 318 compares the signal PHASE from the counter control 310 and the signal COUNT_SUM to determine timing of the signal and output the signal PHASE. The phase signal is also used to control the timing of the signals UP and DN, as will be described in more detail below.

While not illustrated in FIG. 3, the delay detection circuit 214 further includes a circuit similar to the circuit 300 for generating a reference phase signal PHASE' indicating the timing of the center of each optical pulse received by the reference SPAD array 212. The delay detection circuit 214 estimates the time of flight of the optical pulses based on the time difference between the phase signals PHASE and PHASE'.

The principles of the described circuit and method for calculating a distance to an object could be applied to arrays formed of other types of photon detection devices or other range detection devices.

Returning to FIG. 6, a processor 602 can be an ASIC or a general purpose computer chip programmed to provide the functions discussed in this disclosure. The processor 602 has an input coupled to an output of the ranging sensor 102. The processor 602 has an input for receiving an electrical signal and an output for transmitting a modulated electrical signal. In addition, the processor 602 receives the ranging data generated by the ranging sensor 102 and uses that ranging data to determine the presence of the user 108.

The processor 602 has a user detector 604 that receives the ranging data and determines position of the user 108, similar to the function of user detector 118. The processor 602 also includes a gain generator 606 coupled to the user detector 604 to compute a gain. The gain generator 606 generates a gain signal in ways similar to those discussed with respect to gain generator 120.

The processor 602 differs from processor 106 in that instead of having an input coupled to the microphone 104, the processor 602 has an input at a Line In port. Similar to processor 106, the processor 602 outputs a modulated electrical signal. In contrast to the Line Out port of the processor 106, which has a signal driven by the processor 106, the Line In port of the processor 602 is a passive load for detecting an input electrical signal to be used by the processor 602. The Line In port is a standard 3.5 mm audio jack. The voltage peaks of the input signal are less than +/− five volts. Alternatively, other port connectors or other signals are used. Each of these processors 106, 602 may include both ports, in and out.

The processor 602 includes a signal modulator 608 that receives an electrical signal from the Line In port of the processor 602 and the gain signal from the gain generator 606. The signal modulator 608 then modulates the electrical signal to produce a modulated electrical signal. The signal modulator 608 modulates the electrical signal by adjusting the electrical signal based on the gain signal. For example, the signal modulator 608 may be any of the types described with respect to signal modulator 124.

The modulated electrical signal is transmitted to a speaker 610. The speaker 610 may be any type of electroacoustic transducer for converting electrical signals into sound. The speaker 610 outputs sounds, such as the vibration of molecules in the environment caused by a change in pressure at the speaker 610. The electrical signal may use any means for communicating the information to be converted into sounds. For instance, the information is communicated using a variable voltage signal. Alternatively, the information is communicated using a varying current signal. The modulated electrical signal from the processor 602 may be directly output to the speaker 610, or may undergo signal conditioning between the processor 602 and the speaker 610. Examples of signal conditioning include signal amplification and signal noise reduction.

The speaker 610 outputs a sound 612 based on the modulated electrical signal from the processor 602. In some embodiments, the sound 612 represents recorded speech that the user 108 is listening to. In other embodiments, the sound 612 is music or is a retransmission of an event to be listened to.

The gain control system 600 implements any of the gain functions discussed with respect to the gain function 500 to modulate the signal received at the Line In port for playback over the speaker 610. The gain function 500 depicted in FIG. 5 represents one embodiment of the functionality of the gain control system 600. The sound 612 is at a low volume when the user 108 is close to the optical sensor 110, the sound 612 is at a medium volume when the user 108 is at a moderate distance from the optical sensor 110, and the sound 612 is at a high volume when the user 108 is far from the optical sensor 110. Then, as the user 108 gets near the end of the range of the gain control system 600, the sound 612 is reduced to its lowest volume.

Figure 8:
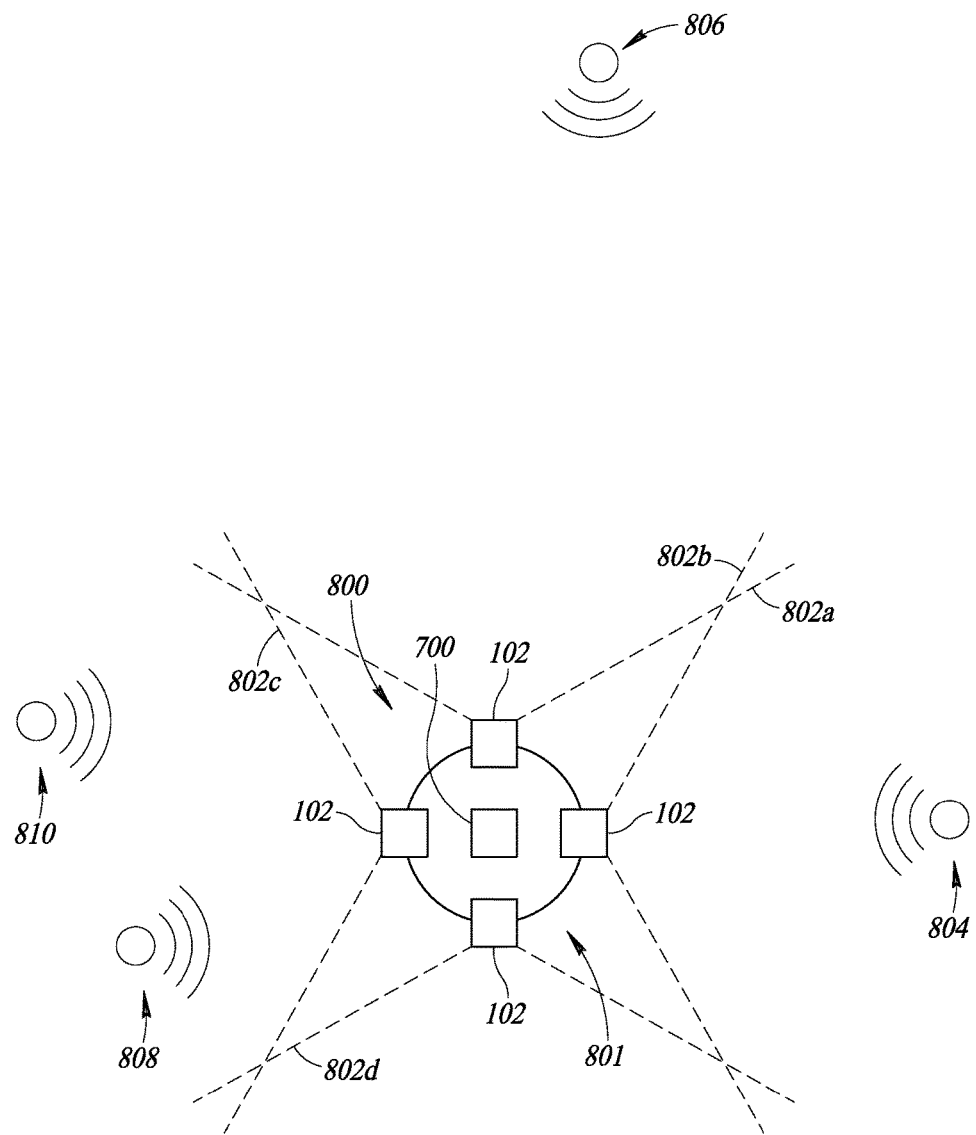
FIG. 8 is a plan view of an exemplary ranging sensor array.
Figure 9:
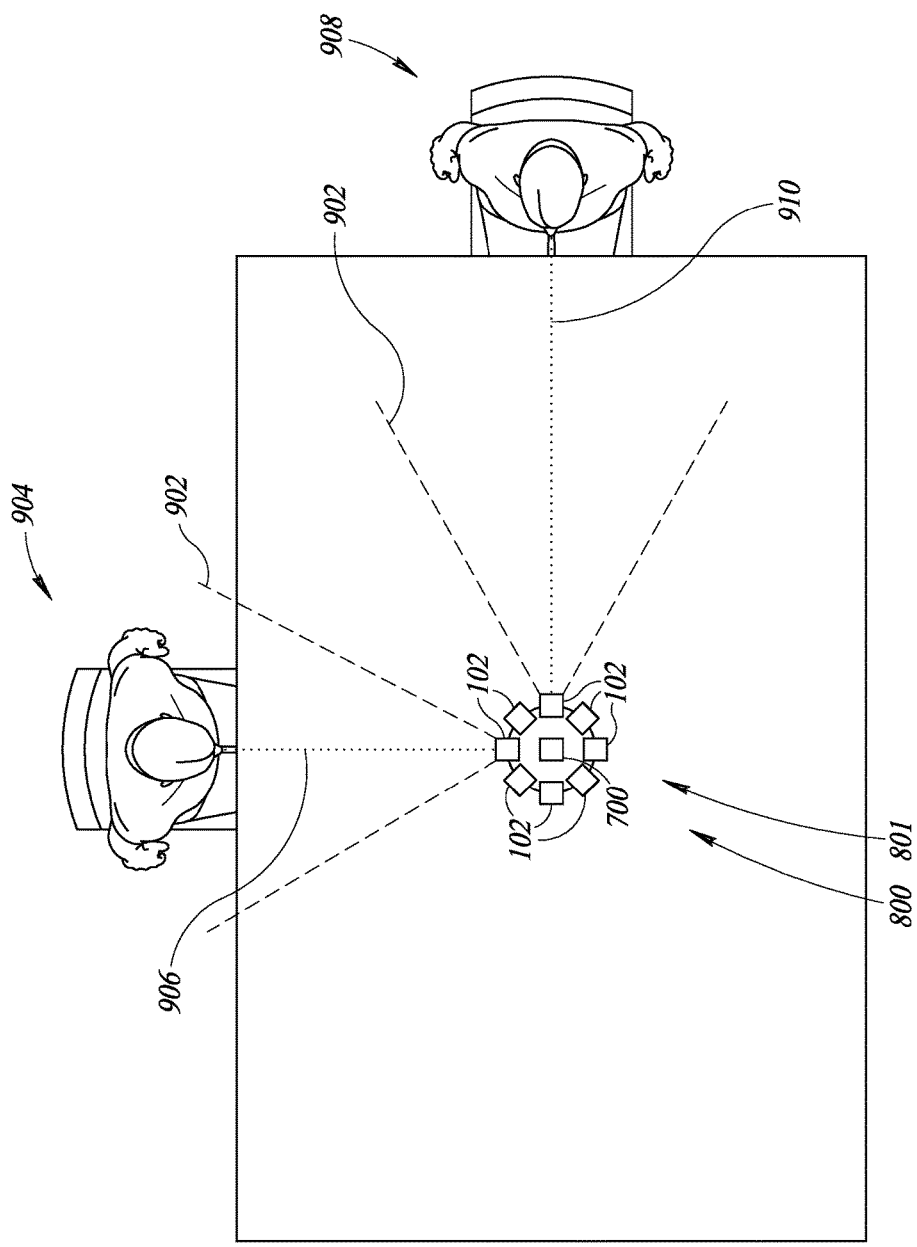
FIG. 9 is a plan view of one embodiment of a gain control system with multi-user support.

FIG. 9 is a gain control system 800 having multi-user support according to an embodiment of the present disclosure. The gain controls system 800 includes a ranging sensor array 801 and a microphone array 700, see FIGS. 7A, 7B, and 8 below. The arrays of ranging sensors and microphones allow this system to detect multiple users across multiple distances and locations in a room and provide different gain based on those distances.

Figure 7A:
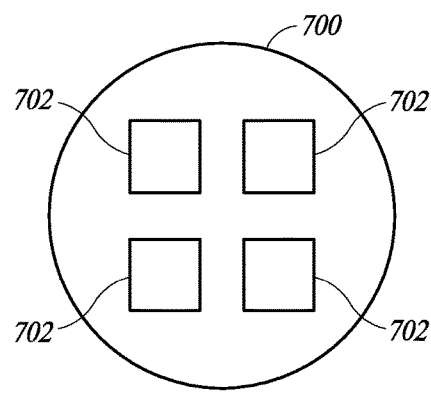
FIG. 7a is a plan view of an exemplary microphone array and FIG. 7b is a plan view of gain diagrams for the exemplary microphone array.

FIG. 7a is a plan view of an exemplary microphone array 700. The microphone array 700 similarly collects sounds and converts the sounds into an electrical signal. The electrical signal can be in any form, including a plurality of parallel electrical signals, with one or more electrical signals per microphone in the microphone array 700.

The microphone array 700 is shown with four acoustic transducing sensors 702. More or less microphone sensors can be used in the microphone array 700. Also, the four microphone sensors 702 are shown arranged at the corners of a square. Other arrangements are possible, such as a linear or a curved arrangement in order to collect sounds from all directions, such as at a conference room table.

Figure 7B:
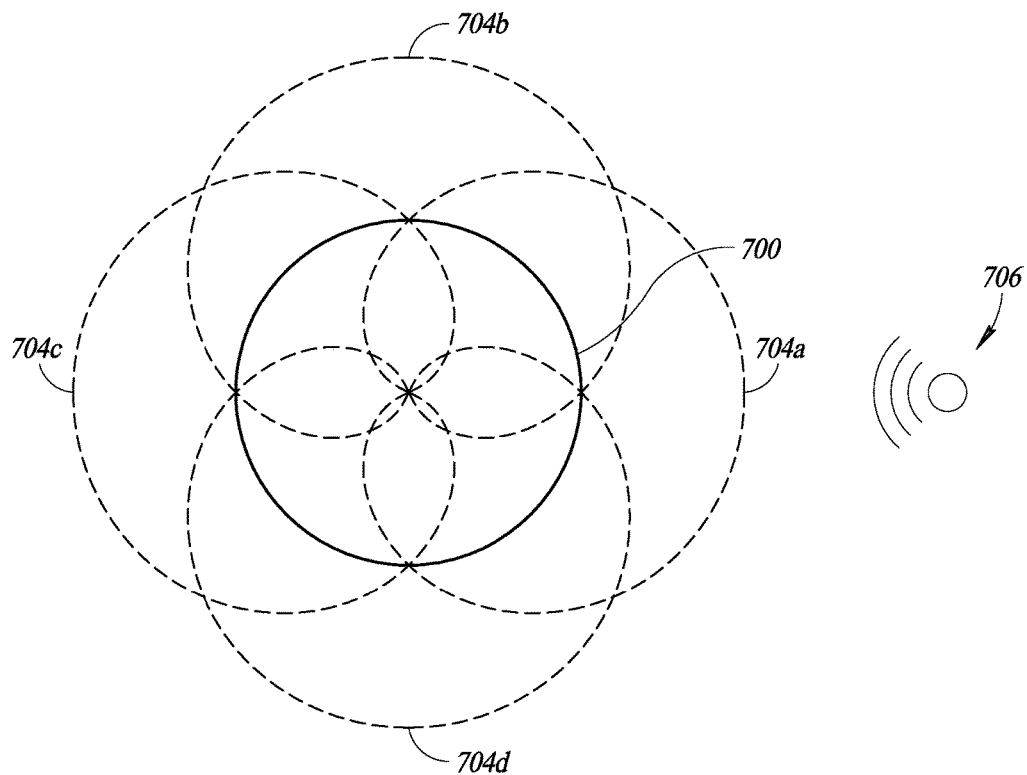

FIG. 7b is a plan view of gain diagrams that correspond to the exemplary microphone array 700. The microphone array 700 is depicted with a center at a center of a circular gain chart. The circular gain chart associates sounds received from each respective direction with the amount of gain applied depending on an orientation of each microphone in the microphone array 700.

When an array of sensors are spaced apart from one another in a known way, comparing signals received at each sensor can indicate position information. For instance, with the microphone array 700 the microphone sensor of the microphone sensors 702 that first detects a signal is the closest to that signal source, and the microphone sensor of the microphone sensors 702 that detects the signal last is the furthest from the signal source. The timing of receipt of the signals combined with known spacing between the microphone sensors 702 and the known speed of signal propagation allows the microphone array 700 to isolate signals from different directions from one another. This can be used to identify a relative location of a user speaking.

The microphone array 700 shown in FIG. 7b is depicted having sufficient sensitivity to distinguish four directions. Other levels of sensitivity are possible. FIG. 7b depicts signal gains 704a-d. A first signal gain 704a is associated with a first direction extending away from the microphone array 700 to a right side. A second signal gain 704b is associated with a second direction extending away from the microphone array 700 to a top side. A third signal gain 704c is associated with a third direction extending away from the microphone array 700 to a left side. Finally, a fourth signal gain 704d is associated with a fourth direction extending away from the microphone array 700 to a bottom side.

Because microphone arrays are not able to act as perfect directional filters, each of the signal gains 704a-d have a gain value greater than zero in nearly every direction, defining the center of the gain diagram as a zero gain. As a sound source is rotated around the microphone array 700, the microphone array 700 will vary the gain according to the radial measurement between the center of the gain diagram and the gain signal being applied, with the highest gain achieved when the selected gain signal is the furthest from the center of the gain diagram, and the lowest gain achieved when the selected gain signal is the closest to the center of the gain diagram.

In one example, a sound source 706 is present to the right of the microphone array 700. If the microphone array 700 applies the gain profile of the first signal gain 704a, the signal will be given a highest gain setting. If the microphone array 700 applies the gain profile of the second signal gain 704b, the signal will be given a medium gain setting. The medium gain setting is depicted in that, along a radius between the sound source 706 and the center of the gain diagram, the second signal gain 704b extends about half the distance as the first signal gain 704a. If the microphone array 700 applies the gain profile of the third signal gain 704c, the signal will be given a low gain setting or a zero gain setting. The low or zero gain setting is depicted in that, along a radius between the sound source 706 and the center of the gain diagram, the third signal gain 704c extends either not at all, or only negligibly. If the microphone array 700 applies the gain profile of the fourth signal gain 704d, the signal will be given a medium gain setting, similar to the medium gain setting for the second signal gain 704b. The medium gain setting is depicted in that, along a radius between the sound source 706 and the center of the gain diagram, the fourth signal gain 704d extends about half the distance as the first signal gain 704a. In this way, the microphone array 700 can target sounds from certain directions over sounds from other directions.

FIG. 8 is a plan view of a gain control system 800 with a ranging sensor array 801 that can be incorporated in system with the microphone array 700, according to one embodiment. The ranging sensor array 801 provides similar functionality to the ranging sensor 102 described above, as it includes a plurality of ranging sensors 102 to increase the overall field of view of the gain control system 800. This changes the field from a unidirectional field of view in FIG. 1 to 360 degree field of view as the field of view of the ranging sensors overlap.

As illustrated, there are four ranging sensors 102 each having a field of view 802a-d that overlaps. A larger number of ranging sensors can be included to ensure overlapping fields of view. For example, some ranging sensors have a 30 degree field of view.

The ranging sensors 102 are in the same plane positioned around the microphone array. Thus, the overall field of view of the ranging sensor array 801 is 360 degrees, as is shown in FIG. 8. The fields of view 802a-d overlap adjacent fields-of-view. In other embodiments, the fields of view 802a-d do not overlap. The ranging sensor array 801 processes the ranging data from each of the ranging sensors 102 and merges the ranging data, accounting for overlap in the fields of view 802a-d. Alternatively, the ranging sensor array 801 outputs individual ranging data from each ranging sensor 102 as parallel data streams. Other embodiments are also possible for outputting the data from the ranging sensor array 801 to other components of the gain control system 800.

The ranging sensor array 801 can be used in conjunction with the microphone array 700. For example, the ranging sensor array 801 detects a user 804 in a field of view 802a. The gain control system 800 then directs the microphone array 700 to apply the signal gain 704a to focus the audio signal gain on the direction of the user 804. The gain control system 800 will modulate the received audio signal based on the distance after the signal has been conditioned to focus on the sounds coming from the direction of the user 804. Because the distance is short, the gain applied according to distance is low.

The ranging sensor array 801 also detects a user 806 in a field of view 802b. The gain control system 800 then directs the microphone array 700 to apply the second signal gain 704b to focus the audio signal gain on the direction of the user 806. The gain control system 800 will modulate the received audio signal based on the distance after the signal has been conditioned to focus on the sounds coming from the direction of the user 804. Because the distance is far, the gain applied according to distance is high.

In addition, the ranging sensor array 801 detects a user 808 and a user 810 in a field of view 802c. The gain control system 800 then directs the microphone array 700 to apply the third signal gain 704c to focus the audio signal gain on the direction of the users 808 and 810. The gain control system 800 will modulate the received audio signal based on the distance after the signal has been conditioned to focus on the sounds coming from the direction of the users 808 and 810.

Because the microphone array 700 cannot differentiate between two sounds coming from the same direction but from different distances, the gain control system 800 will set the distance and corresponding signal gain according to distance of the nearest user. In this case, because the distance to the user 808 is short, the gain applied according to distance is low. Although the ranging sensor array 801 may be able to detect the user 810, the system can discard that information having determined the user 808 is closer to the gain control system 800. In other embodiments, the distance can be set according to other functions when more than one user has been detected, such as using the distance for the farther away user, or using a mean or median distance for a group of users.

The ranging sensor array 801 detects no user in a field of view 802d. The microphone array 700 then applies the fourth signal gain 704d to focus the audio signal gain on the direction of the field of view 802d and modulates the received audio signal based on no user detection. Alternatively, the microphone array can automatically attenuate the signal as no user is detected.

Figure 4:
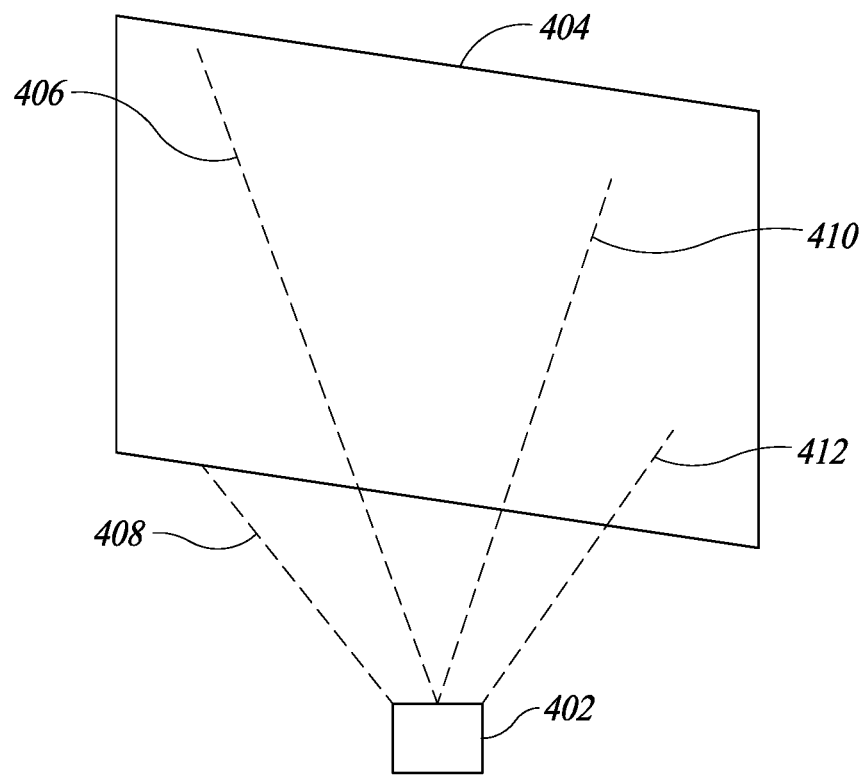
FIG. 4 is a perspective view of a ranging sensor having multi-zone detection and value outputs.
Figure 4:
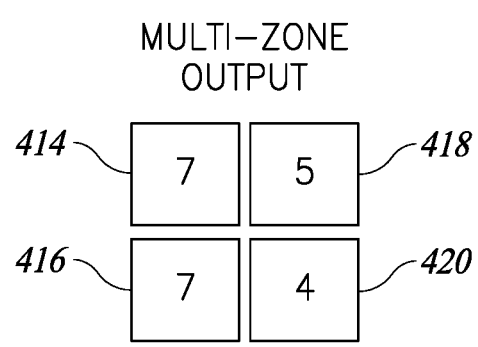

Using a high density of ranging sensors or multi-zone, multi-range style ranging sensors allows for detection of two sounds coming from nearly the same direction. FIG. 4 is an example of a ranging sensor 402 having multi-zone detection that can detect different distances with a single sensor. The ranging sensor 402 is shown directed towards an obstruction 404, with an angled planar surface (with a normal vector that is not parallel to a normal vector from the lens of the ranging sensor 402). Thus, different sections of the obstruction 404 are at different distances from the ranging sensor 402. The obstruction may be two people who are within a field of view of the ranging sensor, but are at different distances. This ranging sensor can detect that there are two people and determine the different distances.

Multi-zone detection capabilities include hardware or software implemented capabilities. Exemplary hardware implementations include more than one detector sensor in each ranging sensor 402 or a lens system that points the detector sensor, the ranging light source, or both. Software implementations include data processing to isolate signals from a particular zone based on signal traits.

In FIG. 4, the ranging sensor 402 has a 4-zone detection capability. Other numbers of zones for zone detection capability are possible (e.g., 9-zone, 12-zone, and 16-zone). The zone detection shape is a uniform square in the embodiment of FIG. 4. The zone detection can be a rectangle or any other shape based on the specific design of the ranging sensor 402, including arrangement of the photon detection cells in the array. Ranging sensor 402 is shown having a square zone detection shape. The square zone detection shape is divided into four equally sized squares. The zones each correspond to a plurality of cells in the array of ranging sensors. A first zone detection 406 is shown corresponding to a top left corner of the obstruction 404. A second zone detection 408 corresponds to a bottom left corner of the obstruction 404. A third zone detection 410 corresponds to a top right corner of the obstruction 404. A fourth zone detection 412 corresponds to a bottom right corner of the obstruction 404.

Each of the four zones determines the distance to the respective zone of the obstruction 404 from the ranging sensor 402. The zones can be fixed with respect to the ranging sensor 402, or, alternatively, the zones are moved dynamically with respect to the ranging sensor 402 to highlight an area of interest for further inspection. As shown in FIG. 4, each of the four zones detects a portion of the obstruction 404. As the obstruction 404 is angled with respect to the lens of the ranging sensor 402, the different zones detect different differences, i.e., they do not have a uniform value for detected distance to the obstruction 404. For example, the first zone detection 406 is detected at a range associated with a first zone distance 414 having a value of 7. The second zone detection 408 is detected at a range associated with a second zone distance 416 having a value of 7. The third zone detection 410 is detected at a range associated with a third zone distance 418 having a value of 5. The fourth zone detection 412 is detected at a range associated with a fourth zone distance 420 having a value of 4. Thus, the ranging sensor detects the first and second zones to be at a distance associated with a value of 7, the third zone at a distance associated with a value of 5, and the fourth zone at a distance associated with a value of 4.

The decreasing values from the first and second zone distances 414, 416 to the third and fourth zone distances 418, 420 reflect how the left side of the obstruction 404 is farther from the ranging sensor 402 than the right side of the obstruction 404. Additionally, the difference between the third zone distance 418 and the fourth zone distance 420 reflects how the top right corner of the obstruction 404 is farther from the ranging sensor 402 than the bottom right corner. The difference between the third zone distance 418 and the fourth zone distance 420 not being reflected between the first zone distance 414 and the second zone distance 416 is due to the obstruction 404 not having a planar surface, due to hardware or software limitations, or due to some other reason.

The values for the zone distances 414, 416, 418, 420 are a true distance (e.g., 7 represents 7 units of measurement such as 7 centimeters). Alternatively, the value of 7 represents a normalized distance (e.g., a 7 out of 10 with 10 representing the maximum detection distance of the ranging sensor 402 and 0 representing the minimum detection distance of the ranging sensor 402). Alternatively, the value of 7 represents a different unit of measure, such as time. The other zones are any of the different data types discussed. All of the zones can be of a similar data type, such as all outputting a true distance. These values can be output from the ranging device on separate output paths, which are received by the controller. Alternatively, there may be a single output terminal where the different outputs can be interpreted by the controller.

FIG. 9 depicts an embodiment with the ranging sensor array 801 including ranging sensors 102 having a field of view 902 that are narrower than the fields of view 802a-d. Each field of view 902 projects away from a corresponding ranging sensor 102. A first user 904 seated at a table is in the field of view 902 of one of the ranging sensors 102. The first user 904 is a first distance 906 from the respective ranging sensor 102. Additionally, a second user 908 seated at the table is in the field of view 902 of another one of the ranging sensors 102. The second user 908 is a second distance 910 from the respective ranging sensor 102.

In a multi-user system, when the first user 904 is detected sufficiently far away from the second user 908 such that the microphone array 700 can differentiate between the two sound source directions, the gain control system 800 can implement parallel sound processing to separately condition the electrical signals associated with each user 904, 908. For example, the first user 904 is detected at the first distance 906. The first distance 906 is relatively short, so after the microphone array 700 applies a directional gain to the signal to isolate sounds from the first user 904, the gain control system 800 then modulates the isolated electrical signal from the first user 904 with a low gain based on the shorter first distance to the first user 904. In parallel, the second user 908 is detected at the second distance 910. The second distance 910 is longer than the first distance 906, so after the microphone array 700 applies a directional gain to the signal to isolate sounds from the second user 908, the gain control system 800 then modulates the isolated electrical signal from the second user 908 with a medium gain based on the longer second distance 910 to the second user 908. Both of these signals are then output by the gain control system 800.

The various embodiments discussed above with respect to FIGS. 7-9 would also work in a similar fashion with respect to a speaker array.

Figure 10:
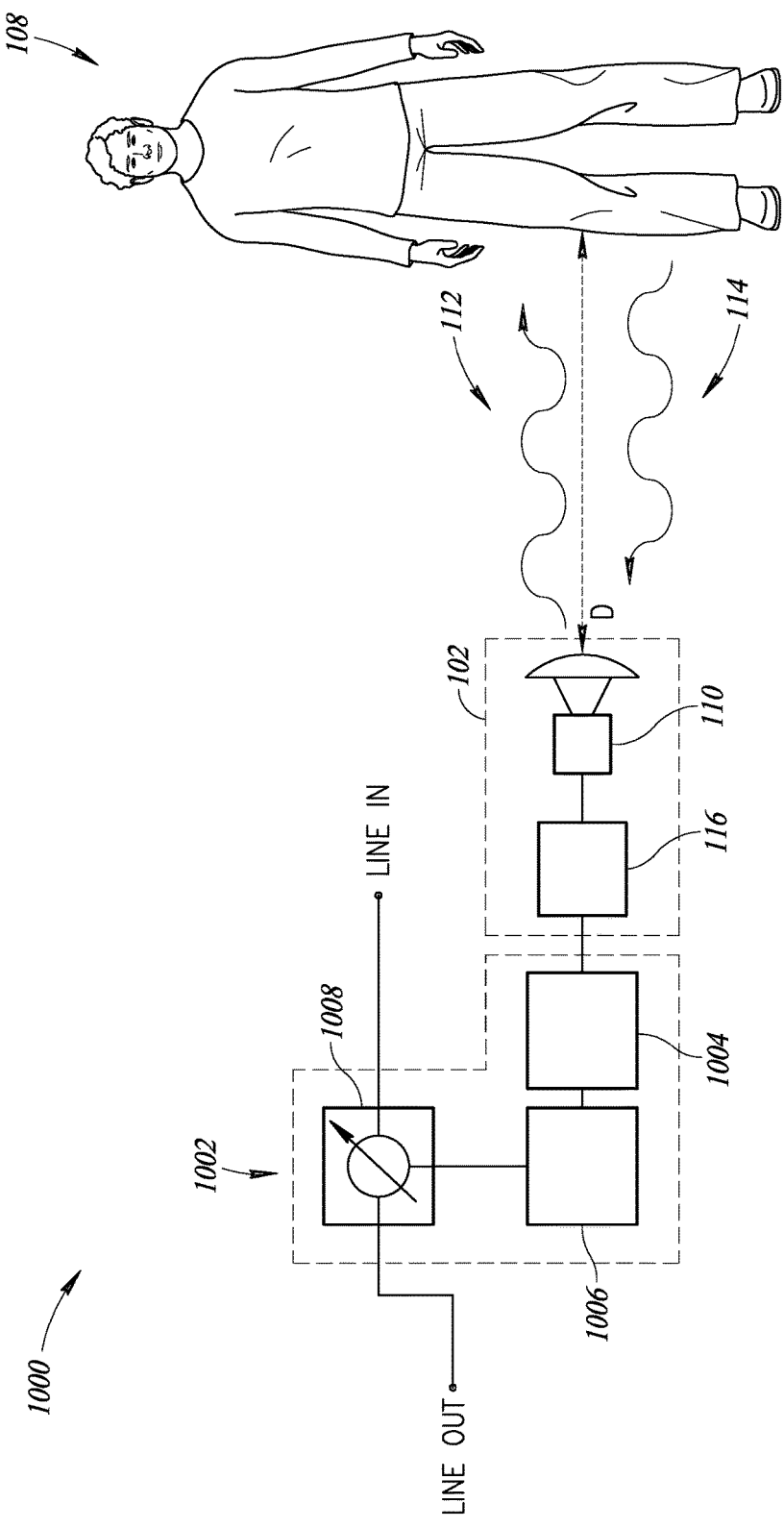
FIG. 10 is a schematic of one embodiment of a gain control system with an in-line connection.

FIG. 10 is a schematic of an alternative embodiment of the gain control system with an in-line connection. Gain control system 1000 shares some common components with the gain control system 100 and the gain control system 600, such as the ranging sensor 102 with the optical sensor 110 and the range estimation circuit 116 to determine distance D.

FIG. 10 also includes a processor 1002. The processor 1002 shares many components and characteristics with the processor 106 and the processor 602. For example, the processor 1002 can be an ASIC. Alternatively, the processor 1002 can be a general purpose computer chip programmed to provide the functions discussed in this disclosure. The processor 1002 has an input coupled to an output of the ranging sensor 102. The processor 1002 has an input for receiving an electrical signal and an output for transmitting a modulated electrical signal. In addition, the processor 1002 receives the ranging data generated by the ranging sensor 102 and uses that ranging data to determine the presence of the user 108.

The processor 1002 includes a user detector 1004 that receives the ranging data and determines position of the user 108, similar to the function of user detector 118. The processor 1002 also includes a gain generator 1006 coupled to the user detector 1004 to compute a gain. The gain generator 1006 generates a gain signal in ways similar to those discussed with respect to gain generator 120.

The processor 1002 differs from the processor 106 and the processor 602 in that instead of having an input coupled to the microphone 104 or an output coupled to the speaker 610, the processor 1002 is installed in-line in a transmission line. Thus, the processor 1002 has a Line In input port similar to the processor 602 and a Line Out output port similar to processor 106. The ports of the processor 1002 can be a standard 3.5 mm audio jack. The voltage peak of the signal can be less than +/− five volts. Alternatively, other port connectors or other signals are used.

The processor 1002 includes a signal modulator 1008 that receives an electrical signal from the Line In port of the processor 1002 and the gain signal from the gain generator 1006. The signal modulator 1008 then modulates the electrical signal to produce a modulated electrical signal. The signal modulator 1008 modulates the electrical signal by adjusting the electrical signal based on the gain signal. For example, the signal modulator 1008 may be any of the types described with respect to signal modulator 124. The signal modulator 1008 then outputs the modulated electrical signal to the Line Out port. Thus the processor 1002 does not receive the electrical signal directly from an input device or output the modulated electrical signal directly to an output device.

The gain control system 1000 implements any of the gain functions discussed with respect to the gain function 500 to modulate the signal received at the Line In port for transmission over the Line Out port. The gain function 500 depicted in FIG. 5 represents one embodiment of the functionality of the gain control system 1000. The modulated electrical signal is at a low amplitude when the user 108 is close to the optical sensor 110, the modulated electrical signal is at a medium amplitude when the user 108 is at a moderate distance from the optical sensor 110, and the modulated electrical signal is at a high amplitude when the user 108 is far from the optical sensor 110. Then, as the user 108 gets near the end of the range of the gain control system 1000, the modulated electrical signal is reduced to its lowest amplitude.

Figure 11:
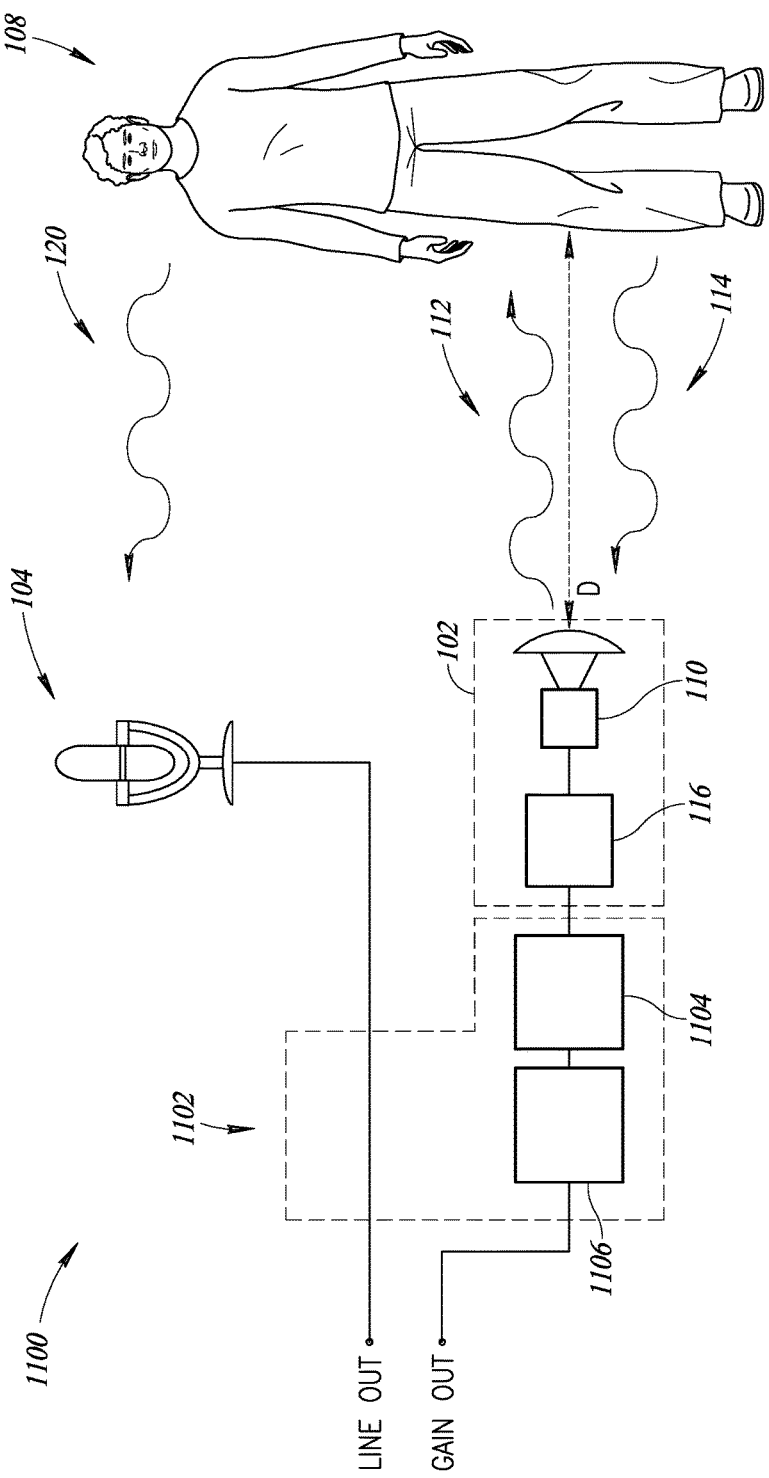
FIG. 11 is a schematic of one embodiment of a gain control system with a gain out signal.

FIG. 11 is a schematic of one embodiment of the gain control system with a gain out signal. Gain control system 1100 shares some common components with the gain control system 100, such as the ranging sensor 102 with the optical sensor 110 and the range estimation circuit 116 to determine distance D. In addition, shown in FIG. 11 is the user 108 from FIG. 1.

FIG. 11 also includes a processor 1102. The processor 1102 shares many components and characteristics with the processor 106. For example, the processor 1102 can be an ASIC. Alternatively, the processor 1102 can be a general purpose computer chip programmed to provide the functions discussed in this disclosure. The processor 1102 has an input coupled to an output of the ranging sensor 102. The processor 1102 has an input for receiving an electrical signal and an output for transmitting a modulated electrical signal. In addition, the processor 1102 receives the ranging data generated by the ranging sensor 102 and uses that ranging data to determine the presence of the user 108.

The processor 1102 has a user detector 1104 that receives the ranging data and determines position of the user 108, similar to the function of user detector 118. The processor 1102 also includes a gain generator 1106 coupled to the user detector 1104 to compute a gain. The gain generator 1106 generates a gain signal in ways similar to those discussed with respect to gain generator 120.

The processor 1102 also has an input coupled to the microphone 104 and the Line Out output port similar to the Line Out port of the processor 106. However the processor does not have a signal modulator. The gain signal from the gain generator 606 is instead output to a Gain Out port for transmission in parallel to the signal from the Line Out port. In an alternate embodiment, the microphone is directly coupled to a Line Out port and bypasses the processor 1102 entirely. And in yet another embodiment, the Line Out port and the Gain Out port are the same port, but the electrical signal and the gain are transmitted separately, such as with different carrier waves.

The Gain Out port of the processor 1102 can be a standard 3.5 mm audio jack. The voltage peak of the signal can be less than +/− five volts. Alternatively, other port connectors or other signals are used.

The gain control system 1100 implements any of the gain functions discussed with respect to the gain function 500 to modulate the signal received from the microphone 104. The gain function 500 depicted in FIG. 5 represents one embodiment of the functionality of the gain control system 1100. The modulated electrical signal is at a low amplitude when the user 108 is close to the optical sensor 110, the modulated electrical signal is at a medium amplitude when the user 108 is at a moderate distance from the optical sensor 110, and the modulated electrical signal is at a high amplitude when the user 108 is far from the optical sensor 110. Then, as the user 108 gets near the end of the range of the gain control system 1100, the modulated electrical signal is reduced to its lowest amplitude.

Figure 12:
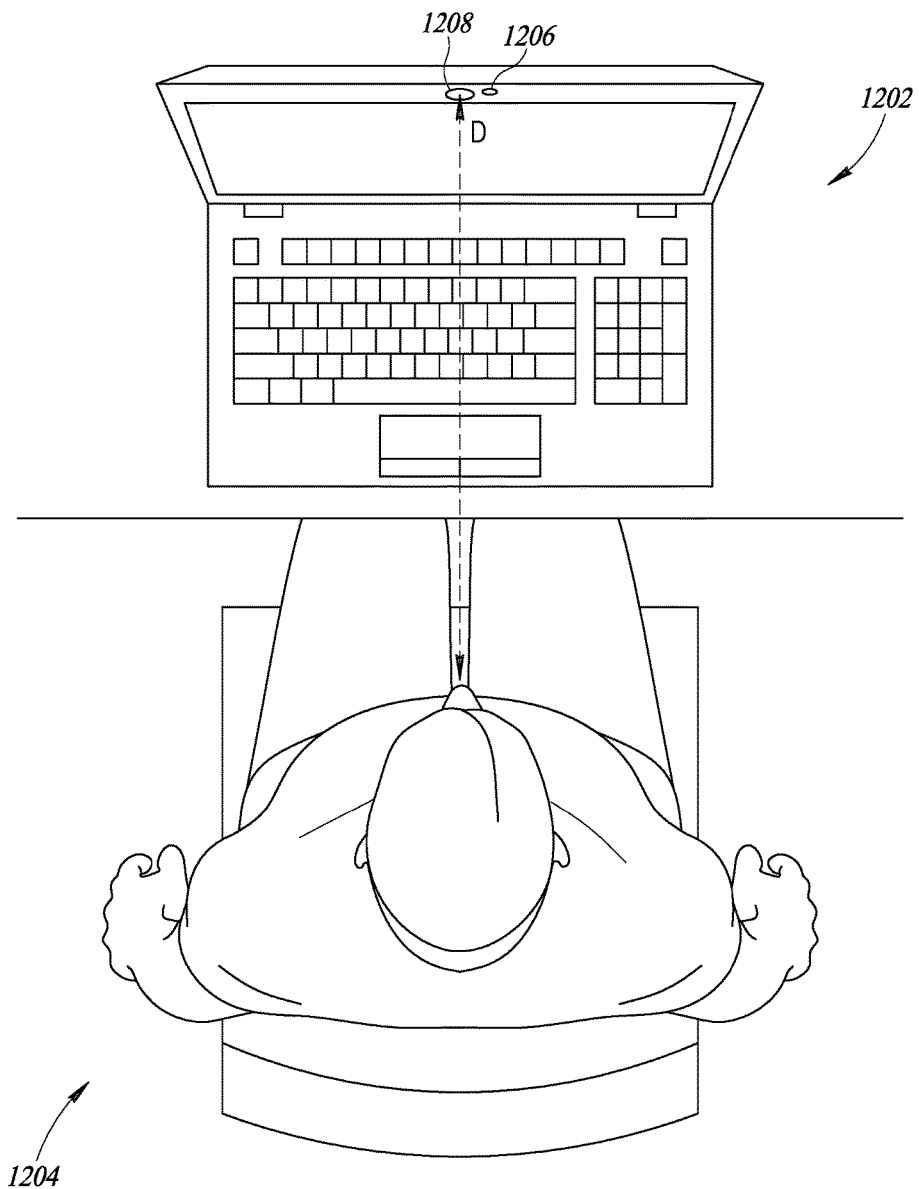
FIG. 12 is an exemplary implementation of one embodiment of a gain control system in a laptop.

FIG. 12 is an exemplary implementation of one embodiment of the gain control system in a laptop 1202. As discussed above with respect to the other figures, the gain control system detects the presence of a user 1204 to determine a gain. The system modulates a signal based on the gain produced.

FIG. 12 depicts components of the gain control system in the laptop 1202, such as a microphone 1206 and a ranging sensor 1208 to detect distance D. The microphone 1206 is any of the types of microphones discussed above with respect to FIG. 1. In addition, the ranging sensor 1208 is any of the types of ranging sensors discussed above with respect to FIG. 1. Not shown, but also included, are speakers for the laptop.

In FIG. 12 the user 1204 is using the laptop to participate in a teleconference meeting. The user 1204 is therefore speaking at times, listening at times, and doing both at times. The ranging sensor 1208 detects the presence of the user by any of the methods discussed above, and determines a distance between the ranging sensor 1208 and the user 1204 to set a gain. As the user 1204 moves closer to the ranging sensor 1208, the gain is reduced, and as the user 1204 moves farther from the ranging sensor 1208, the gain is increased. Thus as the user speaks and moves around, the user may speak at a constant volume, and the system can then compensate in signal differences caused by changes in distance to normalize the signal captured by the microphone 1206.

Similarly, the ranging sensor also controls the speakers. As the user 1204 moves closer to the ranging sensor 1208, the gain is reduced, and as the user 1204 moves farther from the ranging sensor 1208, the gain is increased. Thus as the other conference participants speak while the user 1204 moves around, the user will hear a constant volume. The gain control system 1200 compensates for signal differences caused by changes in distance to the user to normalize the signal heard by the user 1204.

In other embodiments, the ranging sensor controls non-audio signals. For example, if the user 1204 moves closer to the ranging sensor 1208, the gain of a display signal may be adjusted to change the screen brightness to be lower, and as the user 1204 moves farther from the ranging sensor 1208, the gain is increased to increase screen brightness. Thus as the user moves close or far, the screen brightness can be adjusted for the distance to the user. The gain control system 1200 compensates for signal differences caused by changes in distance to the user to normalize the signal seen by the user 1204. Other non-audio signals can be similarly controlled.

Other exemplary implementations of the disclosure include embodiments in a headphone microphone for pilots, and in a conference calling table-top device. In other embodiments, signals other than audio signals can be used and distances other than distances to users can be the basis of the gain. For instance, a gain can be set for a wireless transmission signal based on distance detected between devices. Numerous other variations in which an electrical signal communication would be benefited by modulation according to range are also within the scope of disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
   a first ranging sensor configured to output ranging data;
   a first microphone configured to generate a first signal;
   a second microphone configured to generate a second signal; and
   a processor configured to receive the ranging data, the first signal, and the second signal, to detect a direction to a first user from the ranging data, to generate a first gain in response to the first user, to determine a direction to the first user in response to a comparison of the first signal to the second signal, to attenuate portions of the first audio signal not from the direction to the first user, and to output a third signal based in part on the first gain and the first signal with the attenuated portions.

2. The system of claim 1 wherein the third signal is an audio signal.

3. The system of claim 1 wherein the processor is configured to detect a second user from the ranging data, to generate a second gain in response to the second user, and to output the third signal based in part on the second gain.

4. The system of claim 2, further comprising:
   a speaker coupled to the processor and configured to electroacoustically transduce the third signal.

5. The system of claim 1 wherein the first signal is a gain signal.

6. The system of claim 1 wherein the processor is configured to modulate the second signal based on the first gain to output the third signal.

7. The system of claim 1, further comprising:
   a second ranging sensor, the first ranging sensor having a first field of view and the second ranging sensor having a second field of view, the first field of view overlapping a portion of the second field of view.

8. A device, comprising:
   a first ranging sensor having a first range output;
   a first microphone having a first audio signal output;
   a second microphone having a second audio signal output; and
   a signal modulator having:
      a first range input coupled to the first range output;
      a first audio signal input coupled to the first audio signal output;
      a second audio signal input coupled to the second audio signal output; and
      a third audio signal output, the signal modulator configured to generate a modulated signal based on a signal received at the first audio signal input, a signal received at the second audio signal input, and a signal received at the first range input, and to transmit the modulated signal to the third audio signal output.

9. The device of claim 8, further comprising:
   a gain generator coupled between the signal modulator and the first ranging sensor, the gain generator configured to detect a distance between the device and a user and to generate a gain based on the distance.

10. The device of claim 9 wherein the gain is proportional to the distance.

11. The device of claim 9 wherein the gain is a nonlinear function of the distance.

12. The device of claim 9 wherein the gain is lowest above a maximum distance.

13. The device of claim 9, wherein the gain is a function of the distance according to a first function at distances less than a first distance, the gain is a function of the distance according to a second function at distances between the first distance and a second distance, and the gain is a function of the distance according to a third function at distances more than the second distance.

14. The device of claim 13, wherein the first function has a greater slope than the third function, and the second function has a greater slope than the first function.

15. A method, comprising:
   detecting a distance to a first user from a gain controller;
   generating a first audio signal with a first microphone;
   generating a second audio signal with a second microphone;
   receiving the first audio signal and the second audio signal at the gain controller;
   comparing the first audio signal to the second audio signal;
   determining a direction to the first user based on the comparing the first audio signal to the second audio signal;
   selecting a first gain based on the distance to the first user;
   attenuating a portion of the first audio signal based on the determining the direction to the first user;
   modulating the first audio signal with the attenuated portion based on the first gain with the gain controller; and
   outputting the modulated first audio signal with the attenuated portion.

16. The method of claim 15, further comprising:
   determining a direction to a second user based on the comparing the first audio signal to the second audio signal; and
   attenuating a portion of the first audio signal based on the determining the direction to the second user.

17. The method of claim 15 wherein the selecting the first gain is based on a proportional relationship between the distance and the first gain.

18. The system of claim 1 wherein the first gain is proportional to the distance.

19. The system of claim 1 wherein the first gain is a nonlinear function of the distance.

20. The method of claim 15 wherein the selecting the first gain is based on a non-linear relationship between the distance and the first gain.

* * * * *